(12) United States Patent
Hosomi et al.

(10) Patent No.: US 7,881,097 B2
(45) Date of Patent: Feb. 1, 2011

(54) STORAGE ELEMENT AND MEMORY

(75) Inventors: Masanori Hosomi, Kanagawa (JP);
Hiroyuki Ohmori, Kanagawa (JP);
Minoru Ikarashi, Kanagawa (JP);
Tetsuya Yamamoto, Kanagawa (JP);
Yutaka Higo, Kanagawa (JP); Kazutaka Yamane, Kanagawa (JP); Yuki Oishi, Kanagawa (JP); Hiroshi Kano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/940,915

(22) Filed: Nov. 15, 2007

(65) Prior Publication Data

US 2008/0151607 A1 Jun. 26, 2008

(30) Foreign Application Priority Data

Dec. 26, 2006 (JP) ............................. 2006-350113

(51) Int. Cl.
*G11C 11/00* (2006.01)
(52) U.S. Cl. .................. 365/158; 365/148; 365/171; 977/935
(58) Field of Classification Search ......... 365/171–173, 365/158, 131, 66, 48, 55, 62, 74, 78, 80–93, 365/100, 130, 148, 225.5, 243.5; 257/421, 257/E21.665; 438/3; 977/933–935; 216/22; 428/810–816, 817–825.1, 826
See application file for complete search history.

(56) References Cited

U.S. PATENT DOCUMENTS

| | | | |
|---|---|---|---|
| 6,256,223 B1 | 7/2001 | Sun | |
| 6,845,038 B1 * | 1/2005 | Shukh | ............... 365/171 |
| 2001/0005301 A1 * | 6/2001 | Komuro et al. | ........ 360/324.2 |
| 2002/0163766 A1 * | 11/2002 | Eguchi et al. | ......... 360/324.12 |
| 2005/0002126 A1 | 1/2005 | Fujiwara et al. | |
| 2009/0027813 A1 * | 1/2009 | Carey et al. | ............ 360/324.12 |

FOREIGN PATENT DOCUMENTS

| | | |
|---|---|---|
| EP | 2006165265 | 6/2006 |
| JP | 2003-017782 | 1/2003 |
| JP | 2004-022135 | 1/2004 |
| JP | 2004-207707 | 7/2004 |
| JP | 2005-085821 | 3/2005 |

OTHER PUBLICATIONS

M. Park, Electrical Resistivity of Amorphous Ferromagnetic Materials, Journal of the Korean Physical Society, vol. 27, No. 4, Aug. 1994, pp. 448-451.*

(Continued)

*Primary Examiner*—Richard Elms
*Assistant Examiner*—Harry W Byrne
(74) *Attorney, Agent, or Firm*—K&L Gates LLP

(57) ABSTRACT

Disclosed is a storage element having a storage layer retaining information based on a magnetization state of a magnetic material; a fixed-magnetization layer having a ferromagnetic layer; and an intermediate layer interposed between the storage layer and the fixed-magnetization layer. In the storage element, spin-polarized electrons are injected in a stacking direction to change a magnetization direction of the storage layer so that information is recorded in the storage layer, and resistivity of the ferromagnetic layer forming the storage layer is $8 \times 10^{-7}$ $\Omega$m or more.

12 Claims, 3 Drawing Sheets

OTHER PUBLICATIONS

Slonczewski, "Current-driven excitation of magnetic multilayers," Journal of Magetism and Magnetic Materials, 159 (1996) L1-L7.

Berger, "Emission of spin waves by a magnetic multilayer traversed by a current," Physical Review B, vol. 54, No. 13, Oct. 1, 1996 pp. 9353-9358.

European Communication issued on May 28, 2009, for corresponding European Patent Application 07023744.1.

Japanese Office Action issued on Jun. 30, 2009, for corresponding Japanese Patent Application JP 2006-350113.

Japanese Office Action for corresponding JP2006-350113 issued on Jul. 6, 2010.

* cited by examiner

STORAGE ELEMENT AND MEMORY

CROSS-REFERENCES TO RELATED APPLICATIONS

The present application claims priority to Japanese Patent Application JP 2006-350113, filed in the Japanese Patent Office on Dec. 26, 2006, the entire contents of which are incorporated herein by reference.

BACKGROUND

The present application relates to a storage element suitable for use as a nonvolatile memory in which the direction of magnetization of a storage layer is changed by injecting spin-polarized electrons, and a memory having such storage elements.

High-speed, high-density DRAM is widely used in computers and other information equipments as random access memory.

However, since the information therein disappears when power to DRAM is turned off, there is a demand for nonvolatile memory in which information will not disappear when there is no power.

As one candidate for such nonvolatile memory, a magnetic random access memory (MRAM) in which information is recorded using magnetization in a magnetic material is attracting attention and is currently under development.

In the MRAM, currents are passed through two types of address lines (word lines and bit lines) mutually intersecting approximately at right angles and information is recorded by inverting the magnetization in the magnetic layer of the magnetic storage element at the intersection of address lines by the electric current-induced magnetic field generated from the address lines.

FIG. 1 shows (in perspective view) a schematic diagram of a typical MRAM.

Drain regions 108, source regions 107, and gate electrodes 101 forming selection transistors to select memory cells are formed in portions isolated by element isolation layers 102 in a semiconductor substrate 110 such as a silicon substrate.

Word lines 105 are provided above the gate electrodes 101 and extending in the width direction of the semiconductor substrate 110.

The drain regions 108 are formed so as to be shared by selection transistors on the left and right of the semiconductor substrate 110, and lines 109 are connected to the drain regions 108.

Magnetic storage elements 103 having a magnetic layer the magnetization direction of which is inverted are placed between the word lines 105 and the bit lines 106 that are located above the word lines 105 and extending in the longitudinal direction of the semiconductor substrate 110. These magnetic storage elements 103 are formed of, for example, magnetic tunnel junction (MTJ) elements.

Further, the magnetic storage elements 103 are electrically connected to the source regions via bypass lines 111 located in the longitudinal direction and a contact layer 104 extending below the bypass lines 111.

A current-induced magnetic field is applied to a magnetic storage element 103 by passing currents through a word line 105 and a bit line 106 so as to invert the direction of magnetization in the storage layer of the magnetic storage element 103. As a result, information can be recorded in the magnetic storage element 103.

In a MRAM and other magnetic memories, it is preferable that the magnetic layer (storage layer) in which information is recorded have a constant coercive force to hold recorded information stably.

On the other hand, it is also preferable that a certain amount of electric current pass through address lines to overwrite recorded information.

However, as elements employed in the MRAM are decreased in size, address lines is also formed thinner. As a result, it may be difficult that a sufficiently large current pass through the address lines.

Hence, a memory configured to utilize inversion of magnetization due to spin injection with smaller currents is attracting attention (e.g., Japanese Unexamined Patent Application Publication No. 2003-17782, U.S. Pat. No. 6,256,223, Phys. Rev. B, 54, 9353 (1996), J. Magn. Mat., 159, L1 (1996)).

Inversion of magnetization due to spin injection involves injecting spin-polarized electrons that have once passed through a magnetic material into another magnetic material, thereby causing inversion of magnetization in the other magnetic material.

For example, the direction of magnetization in at least a portion of the magnetic layer of a giant magnetoresistive effect (GMR) element or a magnetic tunnel junction (MTJ) element can be inverted by passing current in the direction perpendicular to the surface of the film of the giant magnetoresistive effect (GMR) element or the magnetic tunnel junction (MTJ) element.

Moreover, spin injection can cause inversion of magnetization without increasing the current, even when the element is very small.

FIG. 2 and FIG. 3 illustrate schematic diagrams of memory configured to utilize the inversion of magnetization due to spin injection as described above, where FIG. 2 is a perspective view, and FIG. 3 is a cross-sectional view.

Drain regions 58, source regions 57, and gate electrodes 51 forming selection transistors to select memory cells are formed in portions isolated by element isolation layers 52 in a semiconductor substrate 60 such as a silicon substrate. Of these, the gate electrodes 51 also serve as word lines extending in the width direction of the semiconductor substrate 60 in FIG. 2.

The drain regions 58 are formed so as to be shared by selection transistors on the left and right of the semiconductor substrate 60 in FIG. 2, and lines 59 are connected to the drain regions 58.

Storage elements 53 having a magnetic layer the magnetization direction of which is inverted are placed between the word lines 55 and the bit lines 56 that are located above the word lines 55 and extending in the left-right direction of the semiconductor substrate 60 in FIG. 2.

These magnetic storage elements 53 are formed of, for example, magnetic tunnel junction (MTJ) elements. In FIG. 3, two magnetic layers 61 and 62 are illustrated, one of the magnetic layers is a fixed-magnetization layer the magnetization direction of which is fixed, and the other magnetic layer is a free-magnetization layer, that is, a storage layer, the magnetization direction of which changes.

The storage element 53 is connected to a bit line 56 and source region 57 via a contact layer 54 in the height direction of the semiconductor substrate 60 to pass current through the storage element 53, and spin injection can cause inversion in the direction of magnetization in the storage layer.

Memory configured to utilize inversion of magnetization due to spin injection is capable of simplifying the device structure compared with ordinary MRAM, as shown in FIG. 1.

Further, in comparison with ordinary MRAM in which inversion of magnetization is caused using an external magnetic field, the write current will not be increased even when the size of the element is reduced.

In the case of MRAM, write lines (word lines and bit lines) and the storage elements are provided separately and information is written (recorded) into the storage elements by passing a current through write lines and utilizing the generated current-induced magnetic field. As a result, a sufficiently large current for writing information can cause to pass through the write lines.

On the other hand, in memory configured to utilize inversion of magnetization due to spin injection, it is preferable to cause spin injection by passing a current through storage elements thereby inverting the direction of magnetization in the storage layer. Since information is written (recorded) into storage elements by directly passing a current through the storage elements in this way, it is preferable that the memory cells include storage elements connected to selection transistors to select memory cells for writing. Here, the current flowing through a storage element is limited to the current which can be passed through a selection transistor (the selection transistor saturation current).

Thus, it may be necessary to write information using a current equal to or less than the saturation current of selection transistors. Consequently, current passed through storage elements may be reduced by improving the efficiency of spin injection.

Further, a large magnetoresistive change rate may be secured for increasing the read signal; to this end, it is effective to use a storage element configuration in which an intermediate layer in contact with both sides of the storage layer is a tunnel insulating layer (tunnel barrier layer).

When using a tunnel insulating layer as an intermediate layer in this way, the amount of current passed through the storage element may be limited to prevent dielectric breakdown of the tunnel insulating layer. Accordingly, the current during spin injection may need controlling.

SUMMARY

However, if an element such as a storage element may not retain information written by application of a current, the element may not be used as memory. Thus, stability against thermal fluctuations in the storage layer (i.e., thermal stability) may need securing.

In the case of a storage element utilizing inversion of magnetization due to spin injection, the volume of the storage layer decreases compared with MRAM devices of the related art, and hence thermal stability may simply appear to be reduced.

If thermal stability of the storage layer is not secured, then the direction of magnetization which has once been inverted may be re-inverted due to thermal effects, resulting in causing a write error.

Thus, thermal stability is a significantly important characteristic in storage elements which utilize inversion of magnetization due to spin injection.

In general, an element which does not expend much energy for writing has a low energy barrier, so that information is easily lost.

On the other hand, an element which uses a large amount of energy for writing can form a high energy barrier, so that information can be retained with stability.

In comparing storage elements utilizing inversion of magnetization due to spin injection and having equal spin injection efficiencies, as the saturation magnetization of the storage layer and the volume of the storage layer are increased, thermal stability increases, and a larger current may be used for writing.

An index of thermal stability can in general be expressed by a thermal stability parameter ($\Delta$).

Here, $\Delta$ is defined by $\Delta=KV/kT$ (where K is the anisotropy energy, V the storage layer volume, k the Boltzmann constant, and T the temperature).

Hence, it is preferable to increase the spin injection efficiency to lower the current used for inversion of magnetization to be equal to or less than the transistor saturation current if using a storage element configured to invert the magnetization direction in a storage layer due to spin injection as a memory and at the same time, it is also preferable to secure thermal stability for stably retaining written information.

According to an embodiment, there are provided a storage element with excellent thermal stability and capable of reducing the write current, and a memory having such storage elements.

A storage element according to an embodiment includes a storage layer retaining information based on a magnetization state of a magnetic material; a fixed-magnetization layer having a ferromagnetic layer; and an intermediate layer interposed between the storage layer and the fixed-magnetization layer. In the storage element according to an embodiment, spin-polarized electrons are injected in a stacking direction to change a magnetization direction of the storage layer so that information is recorded in the storage layer, and resistivity of the ferromagnetic layer forming the storage layer is $8 \times 10^{-7}$ $\Omega$m or more.

A memory according to an embodiment includes a storage layer retaining information based on a magnetization state of a magnetic material; and two types of mutually intersecting lines. The storage element is located between the two types of mutually intersecting lines, through which currents are passed through the storage element in the stacked direction, thereby injecting spin-polarized electrons into the storage element.

The storage element according to an embodiment includes a storage layer retaining information based on a magnetization state of a magnetic material; a fixed-magnetization layer having a ferromagnetic layer; and an intermediate layer interposed between the storage layer and the fixed-magnetization layer. In the storage element according to the embodiment, spin-polarized electrons are injected in a stacking direction to change a magnetization direction of the storage layer so that information is recorded in the storage layer. Specifically, currents are caused to pass through the storage element in the stacked direction to inject spin-polarized electrons into the storage element, thereby recording information in the storage element.

Further, a larger coercive force may be obtained by controlling the ferromagnetic layer forming the storage layer to have resistivity of $8 \times 10^{-7}$ $\Omega$m or more. Thus, thermal stability of the storage element can be increased.

Since the number of scattering sites in the ferromagnetic layer is increased by enhancing the resistivity of the ferromagnetic layer forming the storage element, injected spin electrons easily collide with atoms within the ferromagnetic layer of the storage layer. As a result, since the spin injection efficiency can be improved by increasing the proportion of spins for enhancing inversion of the direction of magnetization in the storage layer, the currents used for inversion of the direction of magnetization in the storage layer can be lowered.

A memory according to an embodiment includes a storage layer retaining information based on a magnetization state of a magnetic material; and two types of mutually intersecting lines. The storage element is located between the two types of mutually intersecting lines, through which currents are passed through the storage element in the stacked direction, thereby injecting spin-polarized electrons into the storage element. Thus, the currents are passed through the storage element in the stacked direction the through the two types of mutually intersecting lines to inject spin-polarized electrons into the storage element, thereby recording information in the storage element.

Further, since the amount of currents used for inversion of the direction of magnetization in the storage layer, power consumption used for recording information in the storage element can be lowered.

In a storage element according to an embodiment, thermal stability indicating the ability to retain information can be secured without increasing the amount of current used to invert the magnetization direction in the storage layer, an excellent balance of characteristics can be obtained.

Consequently, a sufficient operating margin can be secured for the storage element while eliminating operating errors.

Further, according to an embodiment, since the write current is not increased while securing the thermal stability for use as a memory, application of high voltages may not be used for the storage memory, thereby preventing breakdown of insulators in intermediate layers.

Accordingly, a memory capable of securing stable operation and having high reliability can be obtained.

Moreover, the thermal stability of the storage layer can be improved by increasing the coercive force of the storage layer without increasing the intensity of magnetization in the storage layer, so that the intensity of the magnetization in the storage layer can be decreased, and thereby decreasing the current for inversion of magnetization.

Accordingly, the power consumption for the memory as a whole can be decreased by decreasing the power consumption when writing information in the storage element.

According to an embodiment, since spin electrons scatter depending on the direction of spins in the storage layer, the magnetoresistive change rate (MR ratio) can be increased.

Additional features and advantages are described herein, and will be apparent from, the following Detailed Description and the figures.

DETAILED DESCRIPTION

Figure 1:
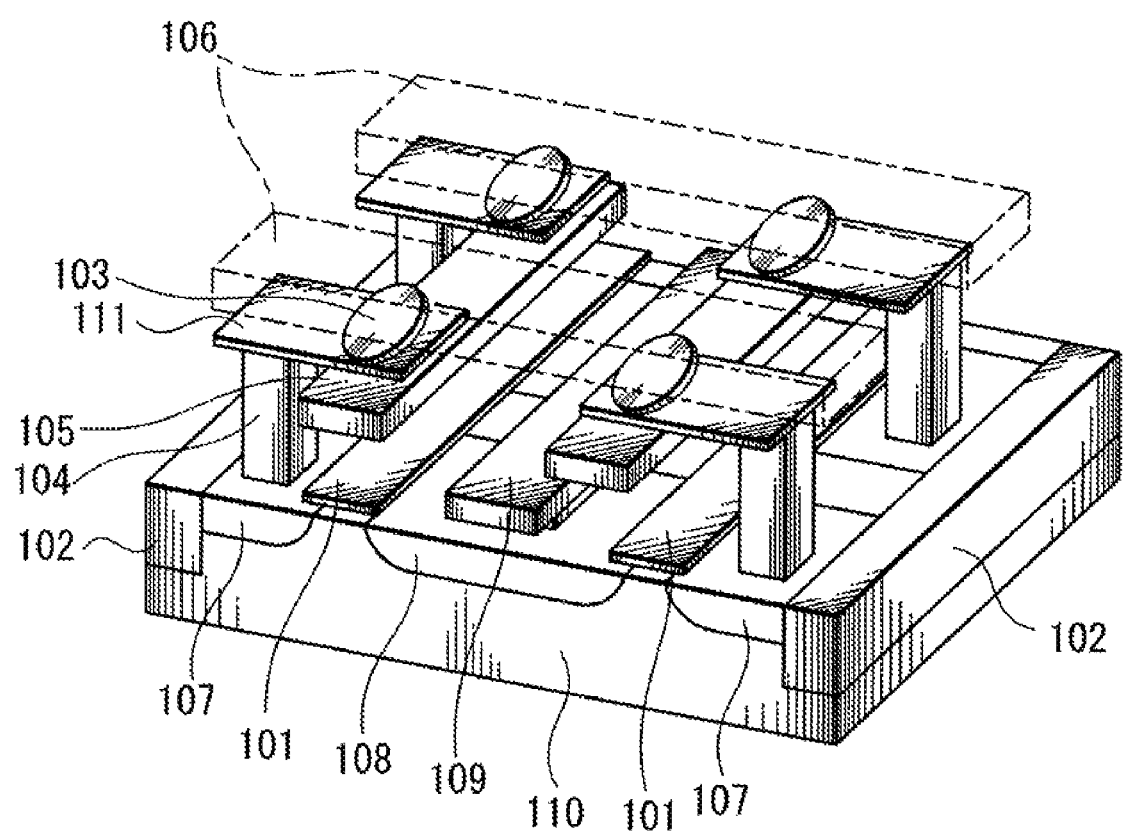
FIG. 1 is a perspective view schematically showing a configuration of a MRAM of the related art.

Prior to describing specific embodiments of the application, the outline of the present application is first illustrated.

Information is recorded by the spin injection to cause inversion of the magnetization direction in the recording layer of the storage element. The storage layer includes a ferromagnetic layer or other magnetic material, and retains information based on the magnetization state (magnetization direction) of the magnetic material.

The basic operation to cause inversion of the magnetization direction in the magnetic layer due to spin injection involves passing a current, intensity of which is equal to or greater than a certain threshold (Ic), through a storage element formed of a giant magnetoresistive effect (GMR) element or a magnetic tunnel junction (MTJ) element, in the direction perpendicular to the plane of the film. At this time, the polarity (direction) of the current depends on the direction of the magnetization to be inverted.

If a current with absolute value smaller than this threshold is passed through the storage layer of the storage element, magnetization will not invert.

The threshold Ic of the current to cause inversion of the magnetization direction in a magnetic layer due to spin injection is expressed phenomenologically by the following equation (1) (e.g., F. J. Albert et al, Appl. Phys. Lett., 77, p. 3809, 2000).

$$Ic = A\frac{\alpha}{\eta}Ms^2 V \qquad (1)$$

In the equation (1), A represents a constant, α represents a spin damping constant, η represents a spin injection efficiency, Ms represents the saturation magnetization quantity, and V represents the volume of the magnetic layer (storage layer).

According to an embodiment, the current threshold value can optionally be set by controlling the volume V of the magnetic layer, and the saturation magnetization Ms, spin injection efficiency and damping constant of the magnetic layer, as indicated in the equation (1).

A storage element includes a magnetic layer (storage layer) that can retain information based on a magnetization state, and a fixed-magnetization layer in which the direction of magnetization is fixed.

With the storage element, written information may have to be retained when used as a memory. As an index of the ability to retain information, the value of the thermal stability index Δ is used. The thermal stability index Δ of the magnetic layer (storage layer) is expressed by the following equation (2).

$$\Delta = B \cdot Hc_o \cdot Ms \cdot V \qquad (2)$$

In the equation (2), B represents a constant, Hc0 represents the coercive force Hc at 0K, Ms represents the saturation magnetization, and V represents the volume.

In general, a value for the thermal stability index Δ of 60 or higher may be used to retain stored information for 10 years at 85° C. There is often a trade-off between this thermal stability index Δ and the current threshold Ic, and both values may need be adequate to maintain memory characteristics.

When causing inversion of magnetization due to spin injection, a current is passed directly through the storage element to write (record) information. Memory cells are formed by connecting storage elements to selection transistors.

In this case, the current flowing in the storage element is limited to a current capable of passing through the selection transistor (the saturation current of the selection transistor), and the allowable range of write currents is also limited.

On the other hand, if the magnetization in the storage layer is reduced, the threshold of the write current can be lowered and the allowable range is broadened. However, the thermal stability (the index Δ) of the storage layer may be interfered. The thermal stability index Δ may have to achieve at least a certain magnitude in forming a memory.

According to an embodiment, the resistivity of ferromagnetic layer in the storage layer is preferably $8 \times 10^{-7}$ Ωm or higher, the storage layer coercive force can be increased. In addition, thermal stability can be improved without increasing the write current, thereby fabricating a stable memory.

Further, according to an embodiment, a magnetic tunnel junction (MTJ) element is formed between the storage layer and the fixed-magnetization layer as a nonmagnetic intermediate layer using a tunnel insulating layer formed of an insulator for accepting the saturation current value of selection transistors.

The magnetoresistive change rate (MR ratio) can be increased by forming a magnetic tunnel junction (MTJ) element using a tunnel insulating layer to increase the read signal intensity compared with cases in which a nonmagnetic conductor layer is used to form a giant magnetoresistive effect (GMR) element.

The magnetoresistive change rate (MR ratio) can be increased by using magnesium oxide (MgO) as the tunnel insulating layer material in comparison to the magnetoresistive change rate obtained by using aluminum oxide widely employed.

In general, the spin injection efficiency depends on the MR ratio; the higher the MR ratio, the more the spin injection efficiency is improved. As a result, the density of the inversion of magnetization current can be lowered.

Hence, the threshold current for writing by spin injection can be lowered by using magnesium oxide as the material of the tunnel insulating layer as an intermediate layer, and information writing (recording) can be performed using small currents. Moreover, the read signal intensity can be increased.

Accordingly, a sufficient MR ratio (TMR ratio) can be secured, the threshold current for writing by spin injection can be lowered, and information can be written (recorded) using small currents. Moreover, the read signal intensity can be increased.

When the tunnel insulating layer is formed using a magnesium oxide (MgO) film, it is desirable that the MgO film be crystallized, and that crystal orientation in the 001 direction be maintained.

According to an embodiment, the intermediate layer (tunnel insulating layer) between the storage layer and the fixed-magnetization layer can, for example, be formed of aluminum oxide, aluminum nitride, $SiO_2$, $Bi_2O_3$, $MgF_2$, CaF, $SrTiO_2$, $AlLaO_3$, Al—N—O, or various other insulators, dielectrics, or semiconductors in addition to using magnesium oxide.

It is desirable that the fixed-magnetization layer have anisotropy in one direction, and the storage layer have a uniaxial anisotropy.

Further, it is preferable that the film thicknesses of the fixed-magnetization layer and of the storage layer be in a range of 1 nm to 30 nm.

Other parts of the storage element can be formed similar to the known configurations of storage elements of the related art which use spin injection to record information.

The fixed-magnetization layer may include the magnetization direction fixed either as a ferromagnetic layer alone, or be formed by utilizing the antiferromagnetic coupling of an antiferromagnetic layer and a ferromagnetic layer.

The fixed-magnetization layer may also include a single ferromagnetic layer, or may have a stacked ferrimagnetic structure in which a plurality of ferromagnetic layers is stacked with nonmagnetic layers interposed therebetween.

When a stacked ferrimagnetic structure is used for the fixed-magnetization layer, the sensitivity to external magnetic fields of the fixed-magnetization layer can be reduced, so that magnetization fluctuations in the fixed-magnetization layer due to external magnetic fields can be suppressed, and the storage element can be operated with stability. Further, the film thicknesses of each of the ferromagnetic layers can be adjusted, and leakage of magnetic fields from the fixed-magnetization layer can be suppressed.

Examples of the material for the ferromagnetic layer forming a fixed-magnetization layer with a stacked ferrimagnetic structure include Co, CoFe, and CoFeB. Examples of the material of the nonmagnetic layers include Ru, Re, Ir, and Os.

Examples of the material for antiferromagnetic layers include FeMn alloy, PtMn alloy, PtCrMn alloy, NiMn alloy, IrMn alloy, NiO, $Fe_2O_3$, or a similar magnetic material.

To such magnetic materials, Ag, Cu, Au, Al, Si, Bi, Ta, B, C, O, N, Pd, Pt, Zr, Hf, Ir, W, Mo, Nb, or other nonmagnetic elements can be added to adjust the magnetic characteristics, or to adjust the crystal structure, crystallinity, physical stability, or various other physical properties.

The film structure of the storage element may be such that the storage layer is positioned either above or below the fixed-magnetization layer.

Information recorded in the storage layer of the storage element may be retrieved by providing a magnetic layer serving as information reference provided near the storage layer of the storage element with a thin insulating film to passing a ferromagnetic tunnel current flowing via the insulating layer, or may be retrieved using a magnetoresistance effect.

Next, specific embodiments are described.

Figure 4:
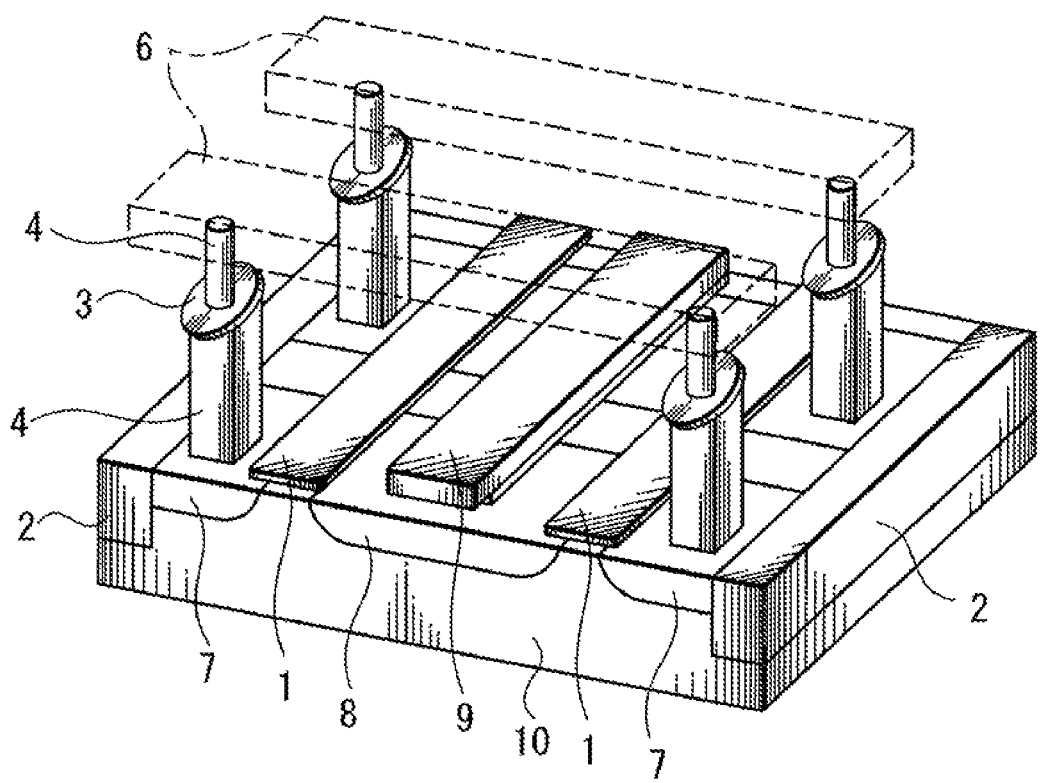
FIG. 4 is a outlined view (as a perspective view) illustrating a memory according to one embodiment.

FIG. 4 is an outlined configuration diagram (perspective view) of a memory according to one embodiment.

In this memory, storage elements capable of retaining information based on magnetization states are positioned in the vicinity of the intersections of two types of address lines (e.g., word lines and bit lines) which mutually intersect at right angles.

Specifically, drain regions 8, source regions 7, and gate electrodes 1 forming selection transistors that are used to select memory cells are formed in portions isolated by element isolation layers 2 on a semiconductor substrate 10 such as a silicon substrate. Of these, the gate electrodes 1 also serve as address lines (e.g., word lines) extending in the width direction of the semiconductor substrate 10.

Drain regions 8 are formed so as to be placed to selection transistors on the left and right of the semiconductor substrate 10; and lines 9 are connected to the drain regions 8.

Storage elements 3 are positioned between the source regions 7 and the other address lines (e.g., bit lines) 6 extending in the longitudinal direction of the semiconductor substrate 10 in FIG. 4. These storage elements 3 have a storage layer formed of a ferromagnetic layer the magnetization direction of which is inverted due to spin injection. A storage element 3 is positioned in the vicinity of the intersection of the two types of address lines 1 and 6. In a storage element 3, the bit line 6 and source region 7 are connected via a contact layer 4 extending below and above the storage elements 3.

Accordingly, a current can be passed through the storage element 3 via the two types of address lines 1 and 6 in the height direction of the semiconductor substrate 10. As a result, the magnetization direction in the storage layer can be inverted due to spin injection.

Figure 5:
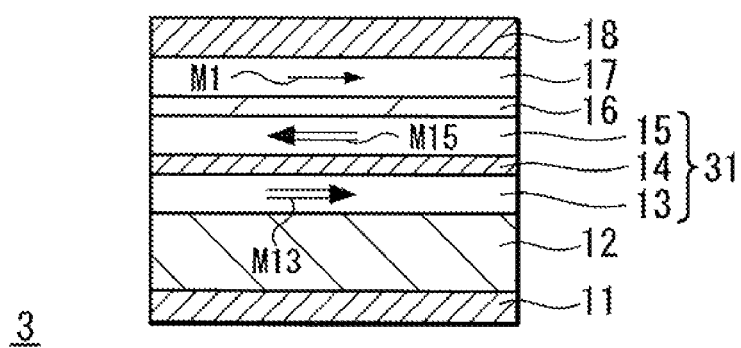
FIG. 5 is a cross-sectional view of a storage element of FIG. 4.

FIG. 5 is a cross-sectional view of a storage element 3 of the memory according to the embodiment.

As shown in FIG. 5, the storage element 3 includes a fixed-magnetization layer 31 provided below the storage layer 17, the direction of magnetization M1 of which is inverted due to spin injection. Below the fixed-magnetization layer 31 is provided an antiferromagnetic layer 12; the magnetization direction of the fixed-magnetization layer 31 is fixed utilizing this antiferromagnetic layer 12. Between the storage layer 17 and the fixed-magnetization layer 31 is provided a tunnel insulating layer 16 that serves as a tunnel barrier layer; an MTJ element includes the storage layer 17 and the fixed-magnetization layer 31. an underlayer 11 is formed below the antiferromagnetic layer 12, and a cap layer 18 is formed above the storage layer 17.

The fixed-magnetization layer 31 has a stacked ferrimagnetic structure. Specifically, the fixed-magnetization layer 31 includes two ferromagnetic layers 13, 15 stacked and antiferromagnetically coupled with a nonmagnetic layer 14 interposed between the ferromagnetic layers 13 and 15. Since the ferromagnetic layers 13, 15 of the fixed-magnetization layer 31 form a stacked ferrimagnetic structure, the magnetization M13 in ferromagnetic layer 13 is directed rightward and the magnetization M15 of ferromagnetic layer 15 is directed leftward, and the two are directed oppositely. As a result, the leakage magnetic flux from the ferromagnetic layers 13, 15 of the fixed-magnetization layer 31 mutually cancel out.

In this embodiment, in particular, the resistivity of the ferromagnetic layer forming the storage layer 17 is $8 \times 10^{-7}$ $\Omega$m or higher.

In order to raise the resistivity of the ferromagnetic layer forming the storage layer 17 to $8 \times 10^{-7}$ $\Omega$m or higher, it is preferable that the concentration of the nonmetallic elements is increased to a certain degree by adding elements selected from the nonmetal elements including B (boron), C (carbon), N (nitrogen), O (oxygen), Mg, Sc, Y, Al, and Si to the ferromagnetic layer.

The resistivities of the ferromagnetic elements Ni, Co, and Fe are $7.2 \times 10^{-8}$ $\Omega$m for Ni, $6.2 \times 10^{-8}$ $\Omega$m for Co, and $1 \times 10^{-7}$ $\Omega$m for Fe.

Hence the ferromagnetic layer of this application has a resistivity eight times or higher than that of normal ferromagnetic layers. Conversely, if the resistivity is $1 \times 10^{-5}$ $\Omega$m or higher, the resistance of the storage layer 17 significantly increases relative to the tunnel insulating layer 16 when forming the storage element 3. As a result, undesirable anomalous increases in element resistance and degradation in the rate of change of resistance are observed.

In the above-described embodiment of the storage element 3, the storage layer 17 has a high coercive force due to an increase in the resistivity of the ferromagnetic layer forming the storage layer 17 to $8 \times 10^{-7}$ $\Omega$m or higher. Accordingly, the thermal stability of the storage layer 17 can be enhanced. The operating region in which current can be passed through the storage element 3 to record information can be increased by increasing the thermal stability of the storage layer 17. Thus, a broad operating margin can be secured, thereby enabling to operate the storage element 3.

Further, the number of scattering sites in the ferromagnetic layer is increased by increasing the resistivity of the ferromagnetic layer, thereby increasing the probability of spin information conducting from injected polarized electrons to localized electrons. As a result, the proportion of polarized electrons inducing inversion of the direction of magnetization M1 of the storage layer 17 is increased, so that the efficiency of spin injection can be improved, and hence the current used for inversion of the direction of magnetization M1 in the storage layer 17 (the inversion of magnetization current) can be lowered.

Further, electrons scatter based on the spin direction in the storage layer 17, so that the magnetoresistive change rate (MR ratio) of the storage element 3 can be improved. For example, an MR ratio of approximately 120% in a configuration of the related art storage element can be increased to approximately that of 140%.

Further, since the coercive force of the storage layer 17 can be increased by enhancing the magnetization of the storage layer 17, it is possible to increase the thermal stability of the storage layer 17. Thus, it is possible to reduce the magnetization of the storage layer 17, thereby lowering the magnitude of current in inversion of magnetization.

Moreover, the magnetization of the ferromagnetic layer forming the storage layer 17 can be adjusted by adding elements selected from the group consisting of Ti, V, Cr, Zr, Nb, Mo, Hf, Ta, and W to the ferromagnetic layer forming the storage layer 17. Accordingly, since the magnetization of the storage layer 17 can be reduced, the magnitude of current in inversion of magnetization can be lowered.

Since it is possible that the magnitude of current in inversion of magnetization be lowered, the amount of current passes in writing information (recording information) to the storage element 3 can be reduced. Thus, power consumption in writing information to the storage element 3 can be decreased.

Accordingly, power consumption of the memory as a whole, formed of memory cells using the storage elements 3 of this embodiment can also be reduced.

Hence, it is possible to produce a memory having excellent information retention characteristics and capable of operating stably with high reliability. Accordingly, it is possible to reduce power consumption of the memory employing such storage elements 3.

Specific materials for the storage layer in the configuration of a storage element of this application were selected, and characteristics thereof were examined.

An actual memory includes semiconductor circuitry for switching in addition to the storage elements as shown in FIG. 4; however, a storage element only include a wafer formed thereon was fabricated in order to examine the magnetization-resistance characteristics of the storage layer.

Example

Figure 2:
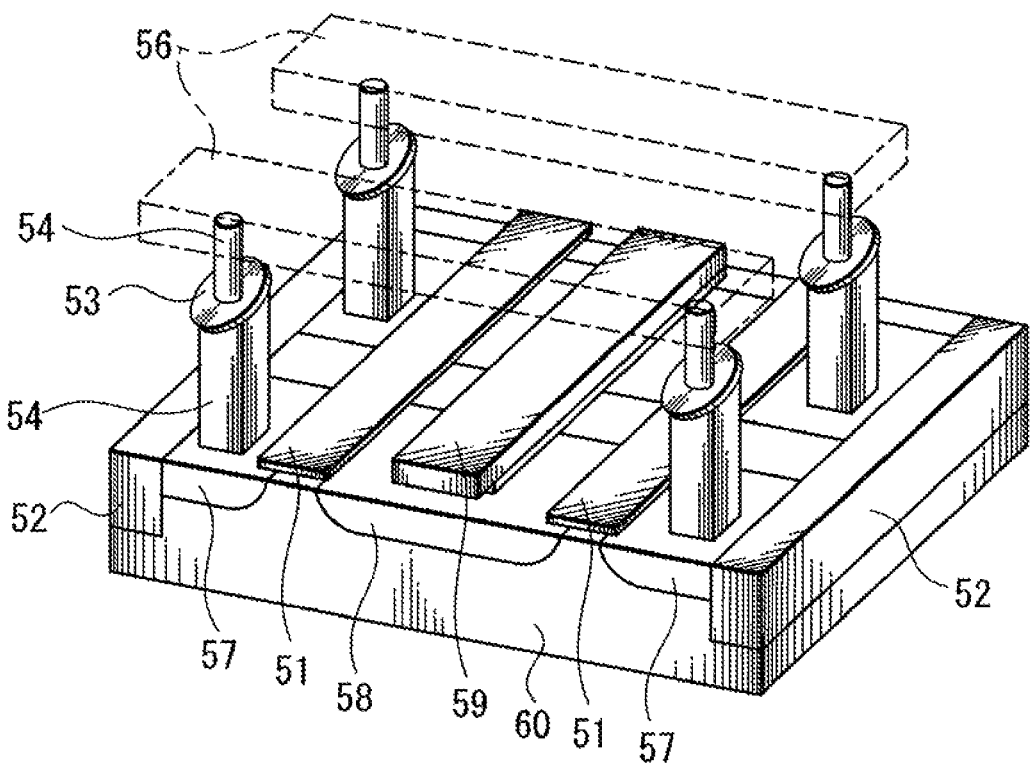
FIG. 2 shows a outlined view (as a perspective view) showing a configuration of a memory utilizing inversion of magnetization due to spin injection.
Figure 3:
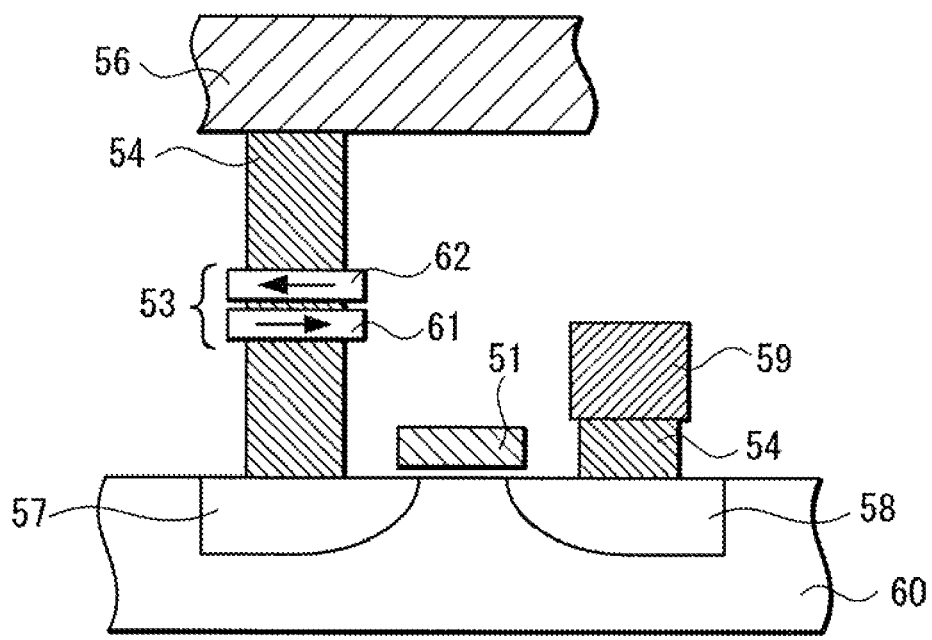
FIG. 3 is a cross-sectional view of the memory of FIG. 2.

A thermal oxide film having thickness 2 μm was formed on silicon substrate having thickness 0.575 mm, and a storage element 3 in shown FIG. 2 was formed on top of the resulting thermal oxide film. Specifically, a storage element 3 includes the following layers as shown in FIG. 2: a 3 nm-thick Ta film as the underlayer 11; 20 nm-thick PtMn film as the antiferromagnetic layer 12; 2 nm-thick CoFe film as the ferromagnetic layer 13, and 2.5 nm-thick CoFe film as the ferromagnetic layer 15 of the fixed-magnetization layer 31; 0.8 nm-thick Ru film as the nonmagnetic layer 14 of a fixed-magnetization layer 31 having a stacked ferrimagnetic structure; 0.8 nm-thick magnesium oxide film as the tunnel insulating layer 16; 3 nm-thick storage layer 17; and 5 nm-thick Ta film as the cap layer 18. In addition, a 100 nm-thick Cu film, not shown (functions as a word line as described below) was provided between the underlayer 11 and the antiferromagnetic layer 12.

In the above film configuration, the composition of the PtMn film includes Pt50Mn50 (atomic percents), and the composition of the CoFe films includes Co90Fe10 (atomic percents).

Layers other than the insulating layer 16 formed of a magnesium oxide film were deposited by DC magnetron sputtering. The insulating layer 16 formed of a magnesium oxide (MgO) film was deposited by RF magnetron sputtering. Further, after depositing all the layers of the storage element 3, the layers were heat treated at 350° C. for four hours in a 10 kOe magnetic field in a heat treatment furnace, thereby controlling the crystal structure and interface of the MgO/ferromagnetic layer and regulating heat treatment of the PtMn film of the antiferromagnetic layer 12.

Next, after masking the word line portions by photolithography, the word lines (lower electrodes) were formed by selective etching where Ar plasma was applied to portions other than those of the word lines in the stacked film. At this time, the portions other than those of the word lines are etched to a substrate depth of 5 nm.

After masking the storage elements 3 with patterns, the stacked film was subject to the selective etching to form the storage elements 3. Portions other than those of storage elements 3 are etched to directly above the Cu layer of the word lines.

In a storage element for evaluating properties, it may be necessary to cause the spin torque to invert magnetization. Accordingly, it is preferable to cause a sufficient current to pass through the storage element to control the resistance value of the tunnel insulating layer. Hence the pattern of the storage elements 3 was formed in an ellipse shape, with minor axis length being 0.09 μm and major axis length being 0.18 μm so that the sheet resistance value ($\Omega\mu m^2$) of the storage element 3 was 20 $\Omega\mu m^2$.

Next, portions other than the storage elements 3 were insulated by sputtering of $Al_2O_3$ to a thickness of approximately 100 nm. Bit lines serving as upper electrodes and pads for measurements were then formed by photolithography to prepare specimens of storage elements 3.

Specimens of storage elements 3 were prepared by having the compositions of the ferromagnetic layer of the storage layer 17 varied to change the resistivity of the ferromagnetic layers.

As the composition of the ferromagnetic layer of the storage layer 17, CoFe with a composition of Co40Fe60 (atomic percents) is used as a basic configuration. An element selected from the group consisting of B, C, N, O, and the group consisting of Mg, Sc, Y, Al, Si was added to CoFe either individually or a combination of two or more.

Film with the same composition as the ferromagnetic layer was deposited on each of the specimens of storage elements 3, and the resistivity ρ was then measured.

Properties of each of the specimens of storage elements 3 were evaluated as described below.

(Measurement of Inversion Current)

Current pulses having a pulse width of 1 μs to 100 ms were passed through a storage element, and the resistance value of the storage element was then measured. The resistance of the storage element was measured with adjusting a temperature to a room temperature of 25° C., and a bias voltage applied to the word line and bit line terminals to 10 mV. In addition, the inversion current value to invert the magnetization in the storage layer was measured by changing the current passing through the storage element. Approximately 20 storage elements having the same configuration were prepared to assess the variability of the inversion current value between the storage elements, and average values of the inversion current were computed.

The inversion current value obtained by passing a current from word line to bit line represents $Ic^+$, and the inversion current value obtained by passing a current from bit line to word line represents $Ic^-$. When a current is passed from word line to bit line, the inversion current changes from the parallel state to the antiparallel state; and when a current is passed from bit line to word line, the inversion current changes from the antiparallel state to the parallel state. Ic values for each pulse width were plotted along the horizontal axis by pulse width, and the resulting extrapolated value at a pulse width of 1 ns was represented by $Ic_0$. The average of the absolute values of $Ic_0$ obtained from both $Ic^+$ and from $Ic^-$ was then calculated, and the resulting values were determined as the values of the inversion current for respective specimens.

(Measurement of Thermal Stability Index Δ)

The thermal stability index Δ was computed based on the following equation (3) which employed values of Ic measured at different pulse widths Ic0 calculated from the method described above. In the equation (3), $\tau_0$ is the reciprocal number of the frequency of spin rotation, and is normally represented by 1 ns.

$$Ic = Ic_o\left[1 - \frac{1}{\Delta}\ln\left(\frac{\tau}{\tau_o}\right)\right] \quad (3)$$

The results of the resistivity, the inversion current value, and the thermal stability index Δ are shown in Table 1 in relation to the materials (compositions) used for the storage layer.

TABLE 1

| Storage layer [at %] | Resistivity ρ [×$10^{-8}$ Ωm] | Inversion current value [μA] | Δ | Remarks |
|---|---|---|---|---|
| 1 70(CoFe)—20B—10Si | 110 | 240 | 70 | Example |
| 2 75(CoFe)—15C—10Y | 95 | 280 | 60 | Example |
| 3 75(CoFe)—15N—10Al | 85 | 290 | 60 | Example |
| 4 80(CoFe)—5O—15Mg | 185 | 220 | 80 | Example |
| 5 75(CoFe)—15B—5O—15Mg | 220 | 210 | 90 | Example |
| 6 75(CoFe)—15B—5C—15Sc | 190 | 225 | 100 | Example |
| 7 75(CoFe)—10C—10N—5Si | 200 | 220 | 70 | Example |
| 8 80(CoFe)—5N—5O—10Al | 210 | 230 | 80 | Example |
| 9 70(CoFe)—15B—5Si—10Mo | 190 | 200 | 70 | Example |

TABLE 1-continued

| | Storage layer [at %] | Resistivity ρ [×$10^{-8}$ Ωm] | Inversion current value [μA] | Δ | Remarks |
|---|---|---|---|---|---|
| 10 | 60(CoFe)—20B—10Mg—10Ta | 250 | 170 | 90 | Example |
| 11 | 80(CoFe)—10C—5Sc—5Nb | 220 | 210 | 90 | Example |
| 12 | 80(CoFe)—10N—5Si—5W | 210 | 240 | 70 | Example |
| 13 | 75(CoFe)—5O—10Mg—10Ta | 265 | 150 | 90 | Example |
| 14 | 80(CoFe)—5O—5Y—10Cr | 230 | 190 | 90 | Example |
| 15 | 75(CoFe)—15B—5Al—5V | 220 | 180 | 70 | Example |
| 16 | 80(CoFe)—5O—10Si—5Ti | 240 | 200 | 90 | Example |
| 17 | CoFe | 8.0 | 450 | 80 | Comparative Example |
| 18 | 90(CoFe)—10Ti | 9.0 | 400 | 70 | Comparative Example |
| 19 | 80(CoFe)—20Zr | 10.2 | 410 | 70 | Comparative Example |
| 20 | 80(CoFe)—20Nb | 10.8 | 430 | 70 | Comparative Example |

As can be seen from Table 1, the value of Δ obtained was 60 or higher for each specimen as the materials were designed to have Δ values of 60 or higher.

The results in Table 1 shows that if the resistivity of the ferromagnetic layer forming the storage layer 17 is 80×$10^{-8}$ Ωm or higher, or 8×$10^{-7}$ Ωm or higher, the value of inversion current ($Ic_0$) can be controlled to 300 μA or less.

This application is not limited to the above-described embodiments, and various configurations may be adopted without deviating from the gist of the application.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A storage element comprising:
a storage layer retaining information based on a magnetization state of a magnetic material;
a fixed-magnetization layer having a ferromagnetic layer; and
an intermediate layer interposed between the storage layer and the fixed-magnetization layer, wherein
spin-polarized electrons are injected in a stacking direction to change a magnetization direction of the storage layer so that information is recorded in the storage layer, and
resistivity of the ferromagnetic layer forming the storage layer is greater than 10.8×$10^{-7}$ Ωm,
wherein the ferromagnetic layer forming the storage layer includes an element selected from the group consisting of C, N, O, Mg, Sc, Y, Al, Si, and combinations thereof.

2. A storage element according to claim 1, wherein the resistivity of the ferromagnetic layer forming the storage layer is 85×$10^{-7}$ Ωm or more.

3. A storage element according to claim 1, wherein the fixed-magnetization layer included two ferromagnetic layers stacked and antiferromagnetically coupled with a nonmagnetic layer interposed between the two ferromagnetic layers.

4. A storage element according to claim 1, wherein a magnetoresistive change rate of the storage element is about 140%.

5. A storage element according to claim 1, wherein an inversion current value of the storage layer ranges from about 150 μA to about 290 μA.

6. A storage element according to claim 1, wherein the ferromagnetic layer forming the storage layer includes at least two elements selected from the group consisting of B, C, N, O, Mg, Sc, Y, Al, Si.

7. A memory comprising:
a storage layer retaining information based on a magnetization state of a magnetic material; and
two types of mutually intersecting lines,
with the storage element having a storage layer retaining information based on a magnetization state of a magnetic material;
a fixed-magnetization layer having a ferromagnetic layer; and
an intermediate layer interposed between the storage layer and the fixed-magnetization layer, wherein
spin-polarized electrons are injected in a stacking direction to change a magnetization direction of the storage layer so that information is recorded in the storage layer,
resistivity of the ferromagnetic layer forming the storage layer is greater than 10.8×$10^{-7}$ Ωm,
the storage element is located between the two types of lines in the vicinity of the intersection thereof, and
currents in the stacking direction flows into the storage element through the two types of lines, and
wherein the ferromagnetic layer forming the storage layer includes an element selected from the group consisting of C, N, O, Mg, Sc, Y, Al, Si, and combinations thereof.

8. A memory according to claim 7, wherein the resistivity of the ferromagnetic layer forming the storage layer is 85×$10^{-7}$ Ωm or more.

9. A memory according to claim 7, wherein the fixed-magnetization layer included two ferromagnetic layers stacked and antiferromagnetically coupled with a nonmagnetic layer interposed between the two ferromagnetic layers.

10. A memory according to claim 7, wherein a magnetoresistive change rate of the storage element is about 140%.

11. A memory according to claim 7, wherein an inversion current value of the storage layer ranges from about 150 μA to about 290 μA.

12. A memory according to claim 7, wherein the ferromagnetic layer forming the storage layer includes at least two elements selected from the group consisting of B, C, N, O, Mg, Sc, Y, Al, Si.

* * * * *